(12) United States Patent
Ikai et al.

(10) Patent No.: US 7,154,786 B2
(45) Date of Patent: Dec. 26, 2006

(54) SEMICONDUCTOR INTEGRATED CIRCUIT DEVICE

(75) Inventors: Toshiharu Ikai, Kodaira (JP); Takenori Ito, Nanyo (JP); Hibiki Takano, Yonezawa (JP)

(73) Assignee: Renesas Technology Corp., Tokyo (JP)

( * ) Notice: Subject to any disclaimer, the term of this patent is extended or adjusted under 35 U.S.C. 154(b) by 98 days.

(21) Appl. No.: 10/960,996

(22) Filed: Oct. 12, 2004

(65) Prior Publication Data

US 2005/0083762 A1 Apr. 21, 2005

(30) Foreign Application Priority Data

Oct. 17, 2003 (JP) .............................. 2003-357324

(51) Int. Cl.
*G11C 16/04* (2006.01)
(52) U.S. Cl. ............ 365/185.18; 365/226; 365/185.11; 365/189.09
(58) Field of Classification Search ........... 365/185.18, 365/185.11, 189.09, 226
See application file for complete search history.

(56) References Cited

U.S. PATENT DOCUMENTS 6,977,850 B1* 12/2005 Tanzawa ................ 365/189.11

FOREIGN PATENT DOCUMENTS

| JP | 2002-135104 | 5/2002 |
| WO | WO 00/46809 | 8/2000 |

* cited by examiner

*Primary Examiner*—Huan Hoang
(74) *Attorney, Agent, or Firm*—Miles & Stockbridge PC

(57) ABSTRACT

A nonvolatile memory working on a different operating voltage from a logical functional unit is to be operated at high speed with a single line voltage supplied from outside. A nonvolatile memory is disposed in a semiconductor integrated circuit device. This semiconductor integrated circuit device is provided with core regulators for generating from an externally supplied line voltage, different operating line voltages, a PLL regulator, a regulator for power supply circuit and a regulator for decoder. The regulator for power supply circuit and the regulator for decoder respectively generate, from the externally supplied line voltage, a first line voltage and a second line voltage to be supplied to the nonvolatile memory. The core regulators generate line voltages to be supplied to internal modules of the semiconductor integrated circuit device, and the PLL regulator generates a line voltage for the PLL.

20 Claims, 3 Drawing Sheets

|  | READ | WRITE | ERASE [V] |
|---|---|---|---|
| WL | 3.8 (CP) | 10.0 (CP) | -11.5 (CP) |
| NON-WL | 0.0 | -2.5 | — |
| LBL | 1.0 | 5.6 (CP) | OPEN |
| SL | 0.0 | 0.0 | OPEN |
| Zg | 3.3 (ZB) | 11.0 (CP) | 0.0 |

SEMICONDUCTOR INTEGRATED CIRCUIT DEVICE

CROSS REFERENCE TO RELATED APPLICATION

The present application claims priority from Japanese patent application No. 2003-357324 filed on Oct. 17, 2003, the content of which is hereby incorporated by reference into this application.

BACKGROUND OF THE INVENTION

The present invention relates to a technique for power supply to semiconductor integrated circuit devices, and more particularly to a technique that can be effectively applied to power supply to semiconductor integrated circuit devices provided with nonvolatile memories.

Recently, in the field of control technology for vehicle-mounted devices, a shift to a high speed and reliable Controller Area Network (CAN) is making progress, and the needs are rising for microcomputers having built-in flash memories, which permit ready rewriting of control programs and data, in order to accelerate the development and improvement of CAN-compatible devices.

A semiconductor integrated circuit device for such purposes usually derives power supply from a single line voltage of around 5 V. On the other hand, the operating voltage for semiconductor integrated circuit devices is gradually reduced along with the miniaturization of semiconductor devices. A nonvolatile memory would operate on 3.3 V, and an internal logic element such as a CPU, on 1.9 V.

In this context, in a semiconductor integrated circuit device, a line voltage of around 5 V supplied from a power supply circuit provided within the semiconductor integrated circuit device is stepped down to generate line voltages of around 3.3 V and 1.9 V, which are supplied as operating line voltages.

According to the present inventors' studies, in order to generate two line voltages (around 1.9 V and around 3.3 V) from a single power supply (around 5 V) from outside, it is conceivable as described in Patent Reference 1 to generate first the line voltage of around 3.3 V by stepping down the single power supply from outside, and then further stepping down that stepped-down 3.3 V power supply to around 1.9 V, or first to step down the single power supply from outside to generate a line voltage of around 1.9 V and then to generate a line voltage of around 3.3 V by stepping up that line voltage of around 1.9 V.

On the other hand, Patent Reference 2 discloses a technique by which 1.8 V for internal power supply is generated by stepping down, with a level shifter, an external power supply of relatively high level of 3.3 V, for instance, as the operating voltage.

[Patent Reference 1] Japanese Unexamined Patent Publication No. 2002-135104.

[Patent Reference 2] WO 00/46809

SUMMARY OF THE INVENTION

An object of the present invention is to provide a semiconductor integrated circuit device capable of causing a nonvolatile memory having a different operating voltage from the logical functional unit to operate at high speed using a single line voltage supplied from outside.

The aforementioned and other objects and novel features of the invention will become more apparent from the description in this specification when taken in conjunction with the accompanying drawings.

Typical aspects of the invention disclosed in the present application will be briefly described below.

A semiconductor integrated circuit device according to the invention comprises a first power supply circuit for generating a first line voltage from a line voltage supplied from outside, and a second power supply circuit for generating a second line voltage from that line voltage.

Other aspects of the invention under the present application will be briefly described below.

A semiconductor integrated circuit device according to the invention may be further provided with a nonvolatile memory, wherein the first line voltage generated by the first power supply circuit is the operating line voltage for the nonvolatile memory.

In this semiconductor integrated circuit device according to the invention, the nonvolatile memory may as well have a step-up/down power supply circuit for generating a step-up voltage and a step-down voltage for reading/writing/erasion from the first line voltage, the first power supply circuit comprising a line power generator for generating the first line voltage to be supplied as the line voltage for the nonvolatile memory, and a line power generator for step-up/down for generating the first line voltage to be supplied to the step-up/down power supply circuit.

Further according to the invention, the nonvolatile memory may have a plurality of memory banks comprising memory arrays in which memory cells are arrayed, and the first line voltage generated by the line power generator maybe supplied to a selection buffer for selecting any arbitrary memory block in the nonvolatile memory.

Also according to the invention, a line power generator for logical functional use may be disposed in the vicinity of the four-sided outer circumference of a semiconductor chip.

Further according to the invention, the line power generator and the line power generator for step-up/down may be arranged in an L shape on the outer circumference of the nonvolatile memory.

Advantages achieved by some of the most typical aspects of the invention disclosed in the present application will be briefly described below.

(1) The operating speed of semiconductor integrated circuit devices can be increased.

(2) Also, the manufacturing costs of semiconductor integrated circuit devices can be substantially reduced.

DESCRIPTION OF THE PREFERRED EMBODIMENTS OF THE INVENTION

A preferred embodiment of the present invention will be described in detail below with reference to the accompanying drawings. Incidentally, in all the drawings illustrating the embodiment, the same members will be denoted by respectively the same reference signs as a rule, and repetition of their description will be dispensed with.

The present inventors discovered that the techniques to generate the line voltage in the above-described semiconductor integrated circuit devices according to the prior art involve the following problems.

That is, where a line voltage of around 1.9 V is to be generated by stepping down a single power supply from outside to generate a line voltage of around 3.3 V and then generating the line voltage of around 1.9 V, this means that the line voltage of around 1.9 V is generated via a step-down circuit for generating a line voltage of around 3.3 V from the single power supply, and accordingly the step-down circuit will require a high drive capacity. This entails a large size of the step-down circuit to result in an increased chip layout area.

Also, according to the other proposal to step down a single power supply to generate a line voltage of around 1.9 V, and then to step up that line voltage of around 1.9 V to generate a line voltage of around 3.3 V, a charge pump circuit (step-up circuit) for stepping up the line voltage of around 1.9 V will be needed. However, for stepping up from around 1.9 V to 3.3 V would require a multi-stage charge pump circuit, which leads to an extended step-up time and therefore may spoil the operating speed of the semiconductor integrated circuit device.

Figure 1:
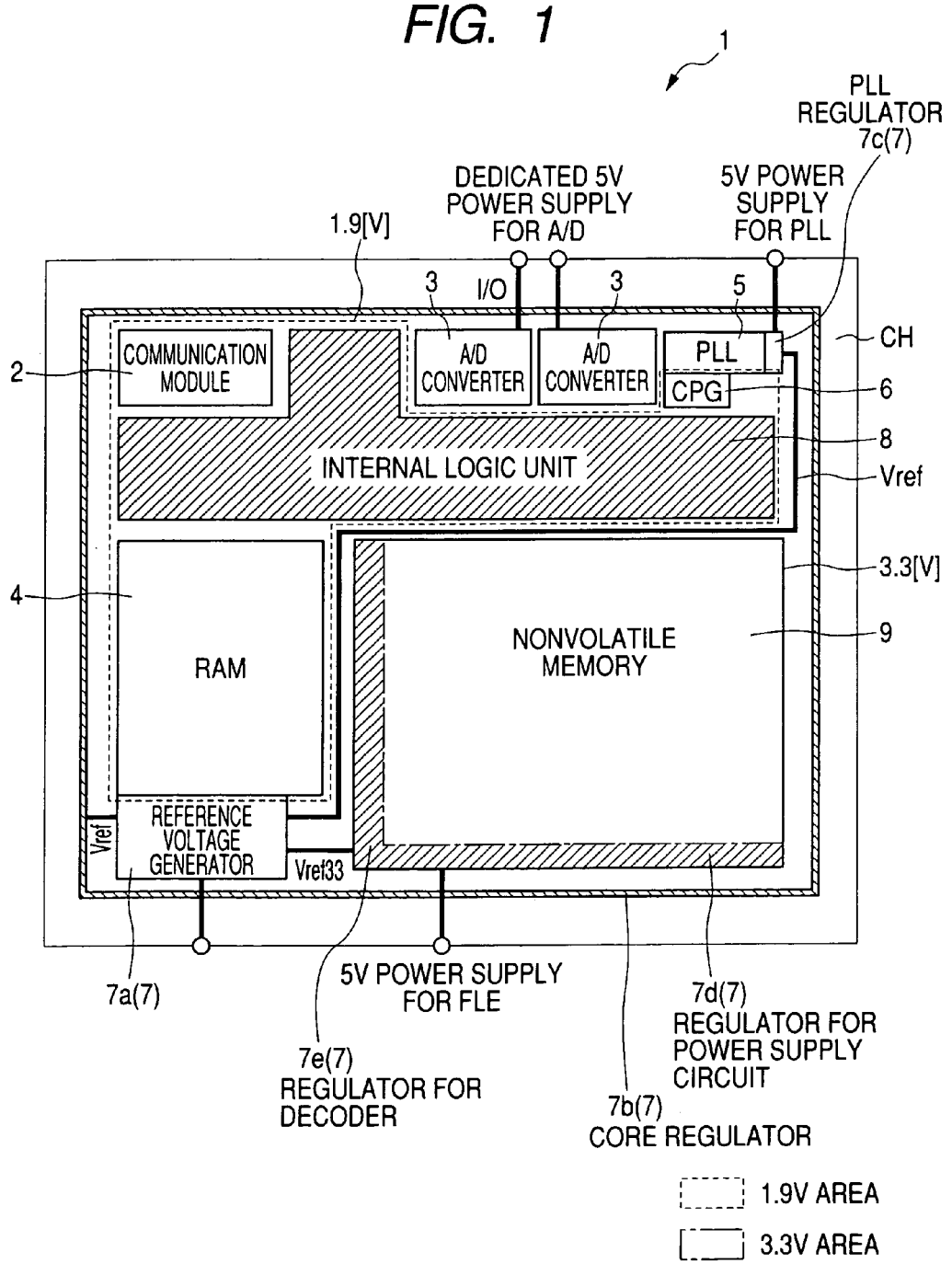
FIG. 1 is a block diagram of a semiconductor integrated circuit device, which is a preferred embodiment of the present invention.
Figure 2:
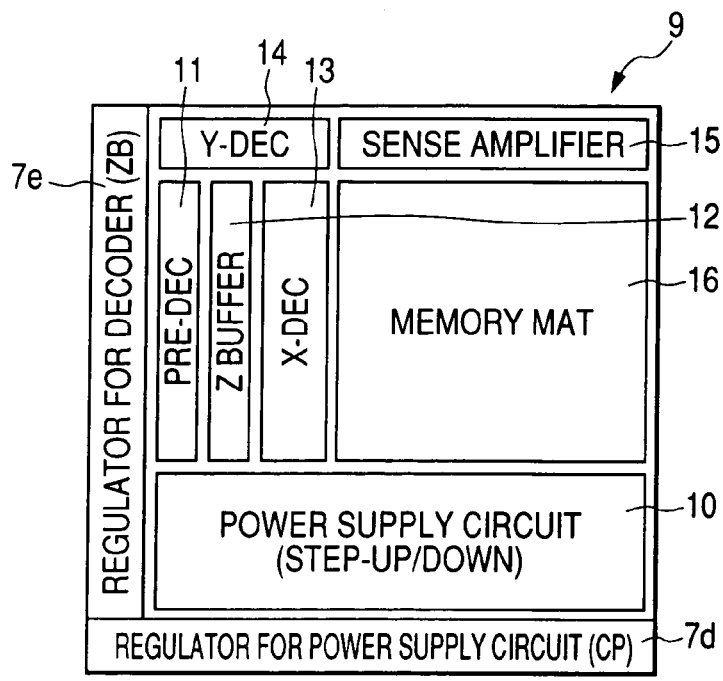
FIG. 2 is a block diagram of a nonvolatile memory provided in the semiconductor integrated circuit device shown in FIG. 1.
Figure 3:
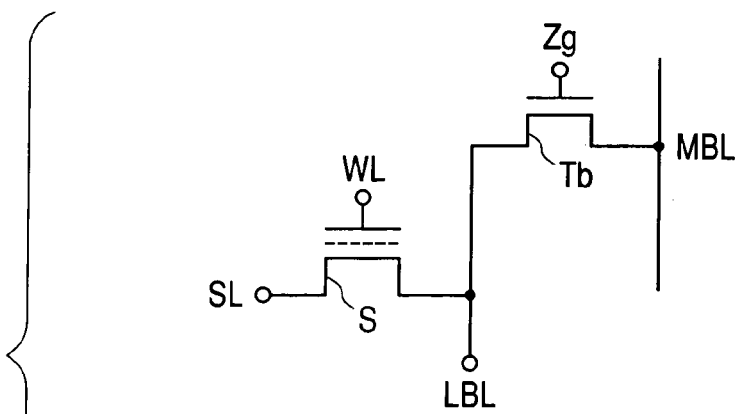
FIG. 3 illustrates the structure of a memory cell in the nonvolatile memory shown in FIG. 2 and voltages applied to different parts in the operations of reading/writing/erasion.
Figure 4:
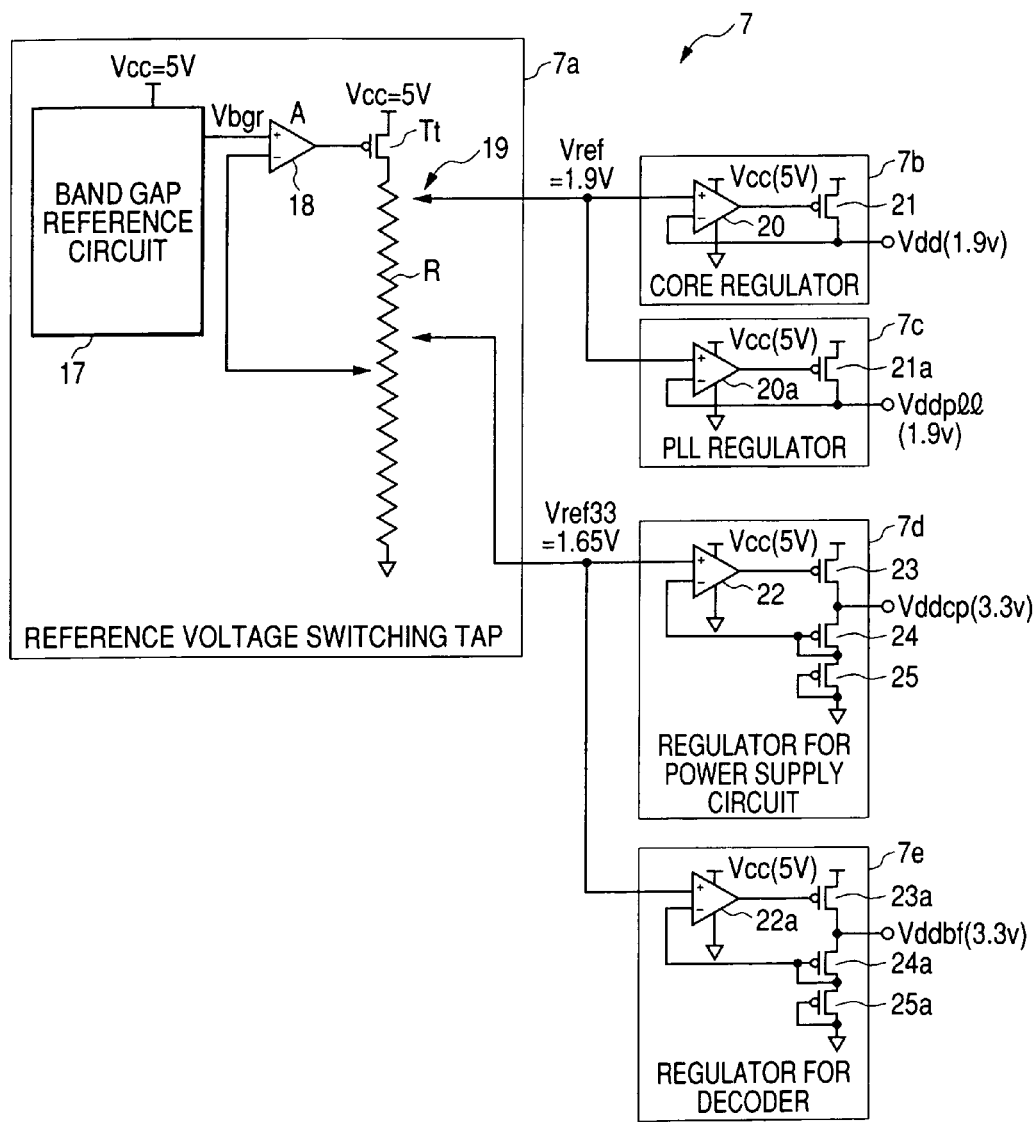
FIG. 4 is a configurational diagram of a power supply circuit provided in the semiconductor integrated circuit device shown in FIG. 1.

FIG. 1 is a block diagram of a semiconductor integrated circuit device, which is a preferred embodiment of the present invention; FIG. 2 is a block diagram of a nonvolatile memory provided in the semiconductor integrated circuit device shown in FIG. 1; FIG. 3 illustrates the structure of a memory cell in the nonvolatile memory shown in FIG. 2 and voltages applied to different parts in the operations of reading/writing/erasion; and FIG. 4 is a configurational diagram of a power supply circuit provided in the semiconductor integrated circuit device shown in FIG. 1.

In this embodiment, a semiconductor integrated circuit device 1 is, for instance, a single chip microcomputer for a vehicle-mounted device. The semiconductor integrated circuit device 1 comprises a communication module (logical functional unit) 2, A/D converters 3, a random access memory (RAM) 4, a phase locked loop (PLL) 5, a clock pulse generator (CPG) 6, a power supply circuit 7, an internal logic unit 8, and a nonvolatile memory 9.

FIG. 1 shows the layout of a semiconductor chip CH in the semiconductor integrated circuit device 1.

In the internal circuit area of the semiconductor chip CH, the communication module 2 is disposed in the upper left. The communication module 2, which is a module for controlling a local area network (LAN), such as a vehicle-mounted system, controls a network for communication.

The PLL (system clock generator) 5 is arranged in the upper right area of the semiconductor chip CH, and underneath the PLL 5, the CPG (system clock generator) 6 is disposed. The PLL 5 multiplies signals supplied from outside, and outputs the multiplied signals. The CPG 6 generates various system clocks from the clock signals multiplied by the PLL 5, and supplies the generated clocks to different modules.

The A/D converters 3 are disposed to the left of the PLL 5. These A/D converters 3 convert analog signals supplied from an external terminal into digital signals. The internal logic unit 8 is laid out in the rest of the internal circuit area above the semiconductor chip CH.

This internal logic unit 8 comprises a central processing unit (CPU), a timer, interfaces including a serial communication interface unit (SCI) and various functional modules for system control purposes including a bus controller.

The power supply circuit 7 comprises a reference voltage generator 7a, core regulators (second power supply circuit, line power generator for logical functions) 7b, a PLL regulator (second power supply circuit, line power generator for system clock) 7c, a regulator 7d for power supply circuit (first power supply circuit, line power generator for stepping up or down), and a regulator 7e for decoder (first power supply circuit, line power generator). Here the absolute value of a first line voltage generated by the first power supply circuit differs from and is greater than the absolute value of any second line voltage generated by the second power supply circuit.

the reference voltage generator 7a of the power supply circuit 7 is disposed underneath the semiconductor chip CH toward the left, and on the four peripheral sides of the semiconductor chip CH, the core regulators 7b are formed. The PLL regulator 7c is arranged to the right of the PLL 5.

the RAM (logical functional unit) 4 is disposed above the reference voltage generator 7a. To the right of the RAM 4, the nonvolatile memory 9 is disposed. On the bottom periphery of the nonvolatile memory 9, the regulator 7d for power supply circuit is disposed, and the regulator 7e for decoder is disposed on the left periphery of the nonvolatile memory 9.

The power supply circuit 7 generates various line voltages from a line voltage VCC of around 5 V supplied from outside, and supplies them to the communication module 2, the RAM 4, the CPG 6, the internal logic unit 8, and the nonvolatile memory 9 as operating line voltages.

The RAM 4, which is a volatile memory permitting random reading/writing, temporarily stores input/output data and operational data. The nonvolatile memory 9 stores control programs including program instructions to be executed by the CPU provided in the internal logic unit 8. The nonvolatile memory 9 writes, reads or erases data in accordance with instructions from the CPU.

FIG. 2 shows the layout configuration of the nonvolatile memory 9.

The nonvolatile memory 9 comprises the regulator 7d for power supply circuit, the regulator 7e for decoder, a step-up/down power supply circuit 10, a pre-decoder 11, a Z buffer (selection buffer) 12, an X decoder 13, a Y decoder 14, a sense amplifier 15 and a memory mat 16.

The regulator 7d for power supply circuit is disposed in the vicinity of the bottom of the nonvolatile memory 9, and the regulator 7e for decoder is disposed in the vicinity of the left side of the nonvolatile memory 9.

The regulator 7d for power supply circuit generates a line voltage (first line voltage) Vddcp of around 3.3 V from the externally supplied line voltage VCC. The regulator 7e for decoder similarly generates a line voltage (first line voltage) Vddbf of around 3.3 V from the externally supplied line voltage VCC, and supplies it to the Z buffer 12. Since the Z buffer 12 selects any arbitrary block in the memory mat 16 in response to a pre-decoded signal from the pre-decoder 11, memory cells will be enabled to operate at high speed when the regulator 7e for decoder is arranged near the Z buffer 12.

Further, the step-up/down power supply circuit 10 is disposed above the regulator 7d for power supply circuit. The step-up/down power supply circuit 10 generates various voltages used for reading/writing/erasion from the line voltage Vddcp generated by the regulator 7d for power supply circuit, and supplies them to the pre-decoder 11, the X decoder 13 and the Y decoder 14. Thus, the step-up/down power supply circuit 10 supplies voltages used on word lines (WL), local bit lines (LBL) and so forth of memory cells S an example of which is shown in FIG. 3. Therefore, when the regulator 7d for power supply circuit is arranged near the step-up/down power supply circuit 10, the length of wiring to connect the regulator 7d for power supply circuit and the step-up/down power supply circuit 10 can be shortened, making it possible to prevent wiring delays.

Thus, by providing the nonvolatile memory 9 with the regulator 7d for power supply circuit and the regulator 7e for decoder and arranging them in the vicinities of the circuits by which the regulators are respectively used, the speed of reading/writing/erasion for each memory cell S can be increased. With a view to high speed and layout ease, the regulator 7d for power supply circuit and the regulator 7e for decoder are arranged on the outer circumference of the nonvolatile memory 9 in this embodiment. More specifically, they are arranged in an L shape as shown in FIG. 2.

Above the step-up/down power supply circuit 10 are disposed, from left to right, the pre-decoder 11, the Z buffer 12, the X decoder 13 and the memory mat 16. Above the pre-decoder 11, the Z buffer 12 and the X decoder 13, the Y decoder 14 is disposed, and the sense amplifier 15 is disposed above the memory mat 16.

The pre-decoder 11 pre-decodes address signals in the row (X) direction. The Z buffer 12 selects any arbitrary block in the memory mat 16 in response to a pre-decoded signal from the pre-decoder 11.

The X decoder 13 decodes the address signals in the row direction pre-decoded by the pre-decoder 11. The Y decoder 14 decodes the address signal in the column (Y) direction. The sense amplifier 15 amplifies data signals from the memory cells S (FIG. 3) in the memory mat 16, and outputs the amplified signals.

Memory cells S, which are the smallest units of memory, are regularly arrayed in the memory mat 16. This memory mat 16 has a configuration in which two or more memory banks are composed by dividing into n by units of a certain number of bits each.

FIG. 3 illustrates the configuration of a memory cell S disposed in the memory mat 16 and voltages used in the operations of reading/writing/erasion.

One of the connecting parts of the memory cell S is commonly connected to a local bit line LBL as shown in the upper half of FIG. 3, and this local bit line LBL is connected to a main bit line MBL via a transistor Tb for block selection. a word line WL is connected to the gate of the memory cell S, and a source line SL is connected to the other connecting part of the memory cell S.

When data in the memory cell S is to be read out, 3.8 V generated by the step-up/down power supply circuit 10 is applied to the word line WL, and one of around 3.3 V generated by the regulator 7e for decoder, to the gate of the transistor Tb for block selection, as shown in the lower half of FIG. 3.

When data is to be written into the memory cell S, a voltage of around 10.0 V, one of around 5.6 V and one of around 11.0 V, all generated by the step-up/down power supply circuit 10, are respectively applied to the word line WL, the local bit line LBL and the gate of the transistor Tb for block selection.

When data in the memory cell S is to be erased, a voltage of around −11.5 V generated by the step-up/down power supply circuit 10 is applied to the word line WL.

FIG. 4 illustrates the power supply circuit 7.

The power supply circuit 7 comprises the reference voltage generator 7a, the core regulators 7b, the PLL regulator 7c, the regulator 7d for power supply circuit and the regulator 7e for decoder as described above.

The reference voltage generator 7a comprises a band gap reference circuit 17, an operational amplifier 18, and a reference voltage switching tap 19. The reference voltage generator 7a generates reference voltages Vref and Vref33 to be supplied to the core regulators 7b, the PLL regulator 7c, the regulator 7d for power supply circuit and the regulator 7e for decoder connected at later stages.

The band gap reference circuit 17 is supplied with the line voltage VCC, and generates, from this line voltage VCC, a reference voltage Vbgr (of around 1.26 V for instance) by utilizing a band gap.

The connection is so arranged that this reference voltage Vbgr be supplied into the plus (+) side input terminal of the operational amplifier 18. The minus (−) side input terminal of the operational amplifier 18 is connected to the reference voltage switching tap 19 so that the voltage be supplied as a negative feedback voltage.

The reference voltage switching tap 19 comprises a transistor Tt and a resistor R, and one of the connecting parts of the transistor Tt is supplied with the line voltage VCC. To the gate of the transistor Tt is connected the output part of the operational amplifier 18, and to the other connecting part of the transistor Tt is connected one of the connecting parts of the resistor R. A reference potential VSS is connected to the other connecting part of the resistor R.

The reference voltage switching tap 19 generates the reference voltage Vref of around 1.9 V and the reference voltage Vref33 of 1.65 V. The reference voltage Vref is supplied to the core regulators 7b and the PLL regulator 7c. The reference voltage Vref33 is supplied to the regulator 7d for power supply circuit and the regulator 7e for decoder.

Each of the core regulators 7b comprises an operational amplifier 20 and a transistor 21 of P-channel metal insulator semiconductor (MIS). The connection is so arranged that the reference voltage Vref be supplied into the plus (+) side input terminal of the operational amplifier 20, and the other connecting part of the transistor 21 is connected to the minus (−) side input terminal of the operational amplifier 20.

the line voltage VCC is connected to one connecting part of the transistor 21, and to the gate of the transistor 21, the output part of the operational amplifier 20 is connected. And the second connecting part of the transistor 21 constitutes the output part of each core regulator 7b, from which a line voltage (second power supply circuit) Vdd is output.

The operational amplifier 20 compares the reference voltage Vref and the line voltage Vdd, amplifies the difference between them, and supplies the amplified difference. The transistor 21 generates the line voltage Vdd of around 1.9 V by controlling the drain current according to the voltage supplied from the operational amplifier 20, and outputs the generated voltage.

Many of such core regulators 7b are formed on the four peripheral sides of the semiconductor chip CH as stated with reference to FIG. 1, and the line voltage Vdd generated by each of the core regulators 7b is supplied as the operating line voltage for the communication module 2, the RAM 4, the CPG 6, and the internal logic unit 8.

Thus, each core regulator 7b generates the line voltage Vdd (1.9 V) from an external power supply Vcc (5 V), and supplies the line voltage Vdd (1.9 V) to the communication module 2, the RAM 4, the CPG 6, and the internal logic unit 8 as their operating line voltages.

Similarly, the PLL regulator 7c, which also comprises an operational amplifier 20a and a transistor 21a of P-channel MOS, generates a line voltage (second line voltage) Vddp11 of around 1.9 V. This line voltage Vddp11 is supplied as the operating line voltage for the PLL 5 (FIG. 1).

Thus, the PLL regulator 7c generates a line voltage VddP11 (1.9 V) from an external power supply Vcc (5 V), and supplies the line voltage Vddp11 (1.9 V) to the PLL 5 as its operating line voltage.

The regulator 7d for power supply circuit comprises an operational amplifier 22 and transistors 23 through 25 of P-channel MOS.

The connection is so arranged that the reference voltage Vref33 be supplied into the plus (+) side input terminal of the operational amplifier 22. The transistors 23 through 25 are connected in series between the line voltage VCC and the reference potential VSS. The output part of the operational amplifier 22 is connected to the gate of the transistor 23.

The minus (−) side input terminal of the operational amplifier 22 and one connecting part of the transistor 25 are connected to the gate of the transistor 24, and the reference potential VSS is connected to the gate of the transistor 25. The connecting part between the transistor 23 and the transistor 24 constitutes the output part of the regulator 7d for power supply circuit, from which the line voltage Vddcp of around 3.3 V is output.

The operational amplifier 22 compares the reference voltage Vref33 and the line voltage Vddcp, amplifies the difference between them, and outputs the amplified difference. The transistor 23 controls the drain current according to the voltage supplied from the operational amplifier 22.

A voltage resulting from division by the transistors 23 through 25 is supplied as the line voltage Vddcp. This line voltage Vddcp is supplied to the step-up/down power supply circuit 10. The step-up/down power supply circuit 10 generates various voltages to be used for reading/writing/erasion as described above, and supplies them to the pre-decoder 11, the X decoder 13 and the Y decoder 14.

Thus, the regulator 7d for power supply circuit generates the line voltage Vddcp (3.3 V) from an external power supply Vcc (5 V), and supplies various voltages to be used for reading/writing/erasion to the pre-decoder 11, the X decoder 13, and the Y decoder 14 via the step-up/down power supply circuit 10 as their operating line voltages.

Also, the regulator 7e for decoder, like the regulator 7d for power supply circuit, comprises the operational amplifier 22a and transistors 23a through 25a of P-channel MIS. The regulator 7d for power supply circuit generates the line voltage Vddbf of around 3.3 V. This line voltage Vddbf is supplied to the Z buffer 12, and used as the drive voltage for the transistor Tb for block selection in write operation.

By separately providing in this way the core regulators 7b and the PLL regulator 7c for supplying the operating line voltage to the internal logic unit 8, the regulator 7d for power supply circuit and the regulator 7e for decoder for supplying the operating line voltage to the nonvolatile memory 9, and generating these voltages from the line voltage VCC supplied from outside, the stepped-up/down voltage used by the nonvolatile memory 9 can be generated at high speed.

Since it is possible to alleviate the burden of driving capacity on each regulator, the regulators can be reduced in size. Further, as it is possible to reduce the unit area of the regulators in the chip, the semiconductor integrated circuit device can be reduced in size.

With these advantages, this embodiment of the invention can significantly increase the operating speed of the semiconductor integrated circuit device 1.

It is also made possible to reduce the semiconductor integrated circuit device 1 in size.

While the invention achieved by the present inventors has been hitherto described with reference to a specific embodiment thereof, the invention is not limited to this embodiment. Obviously the invention can be embodied in various other ways without deviating from its essentials.

For instance, in the embodiment described above, the line voltage to be supplied to the nonvolatile memory is supposed to be stepped down from a line voltage of 5 V to around 3.3 V, the stepped-down voltage may be at some other level than 3.3 V.

Although the foregoing embodiment is supposed to be a semiconductor integrated circuit device 1 having a nonvolatile memory 9, the configuration is not limited to this particular one. Namely, a configuration in which desired voltages are generated for individual modules from the externally supplied line voltage VCC via separate regulators would enable, as does the foregoing embodiment, the burden of driving capacity on each regulator to be alleviated and accordingly the unit area of the regulators in the chip to be reduced, making it possible to reduce the semiconductor integrated circuit device in size.

Further, though two different voltages (1.9 V and 3.3 V) are supposed to be generated from the external voltage VCC, the variety of voltages is not particularly limited to this, but a greater variety of voltages, such as 1.9 V, 3.3 V, and 5 V, could as well be generated from a higher voltage of 5 V or more for instance, and in this case the same advantages can obviously be achieved as in the foregoing embodiment.

What is claimed is:

1. A semiconductor integrated circuit device comprising:
   a nonvolatile memory;
   a first power supply circuit for generating a first line voltage from a line voltage supplied from outside; and
   a second power supply circuit for generating, from said line voltage, a second line voltage which is different from said first line voltage,
   wherein said first line voltage is an operating line voltage for said nonvolatile memory, and
   wherein said second line voltage is an operating line voltage for a logical functional unit and for a system clock generator for generating a system clock to be supplied to said logical functional unit.

2. The semiconductor integrated circuit device according to claim 1,
   wherein said nonvolatile memory includes a step-up/down power supply circuit generating a step-up voltage and a step-down voltage for reading/writing/erasing from said first line voltage, and
   wherein said first power supply circuit comprises:
   a first line power generator generating the first line voltage to be supplied to said nonvolatile memory; and
   a second line power generator generating said first line voltage to be supplied to said step-up/down power supply circuit.

3. The semiconductor integrated circuit device according to claim 2, wherein said nonvolatile memory includes a plurality of memory banks comprised of memory arrays in which memory cells are arrayed, and wherein the first line voltage generated by said first line power generator is supplied to a selection buffer for selecting any arbitrary memory block in said nonvolatile memory.

4. The semiconductor integrated circuit device according to claim 2, wherein said first line power generator and said second line power generator are arranged on an outer circumference of said nonvolatile memory.

5. The semiconductor integrated circuit device according to claim 2, wherein said first line power generator and said second line power generator are arranged in an L shape on an outer circumference of said nonvolatile memory.

6. The semiconductor integrated circuit device according to claim 2, wherein said first power supply circuit is disposed within said nonvolatile memory.

7. The semiconductor integrated circuit device according to claim 2, wherein the absolute value of said first line voltage is greater than the absolute value of said second line voltage.

8. The semiconductor integrated circuit device according to claim 1, wherein said second power supply circuit comprises:

a first line power generator generating the second line voltage to be supplied to said logical functional unit; and a second line power generator generating the second line voltage to be supplied to said system clock.

9. The semiconductor integrated circuit device according to claim 8, wherein said first line power generator is disposed in a vicinity of a four-sided outer circumference of a semiconductor chip.

10. The semiconductor integrated circuit device according to claim 1, wherein said first power supply circuit is disposed within said nonvolatile memory.

11. The semiconductor integrated circuit device according to claim 1, wherein an absolute value of said first line voltage is greater than an absolute value of said second line voltage.

12. A semiconductor integrated circuit device comprising:

a first power supply circuit for generating a first line voltage from a line voltage supplied from outside;

a second power supply circuit for generating, from said line voltage, a second line voltage which is different from said first line voltage; and a nonvolatile memory, wherein the first line voltage generated by said first power supply circuit is the operating line voltage for said nonvolatile memory, wherein said nonvolatile memory includes a step-up/down power supply circuit for generating a step-up voltage and a step-down voltage for reading/writing/erasing from said first line voltage, and wherein said first power supply circuit comprises:

a first line power generator generating the first line voltage to be supplied to said nonvolatile memory; and a second line power generator generating said first line voltage to be supplied to said step-up/down power supply circuit.

13. The semiconductor integrated circuit device according to claim 12, wherein said nonvolatile memory includes a plurality of memory banks comprised of memory arrays in which memory cells are arrayed, and wherein the first line voltage generated by said first line power generator is supplied to a selection buffer for selecting any arbitrary memory block in said nonvolatile memory.

14. The semiconductor integrated circuit device according to claim 12, wherein the second line voltage generated by said second power supply circuit is the operating line voltage for a logical functional unit and for a system clock generator for generating a system clock to be supplied to said logical functional unit.

15. The semiconductor integrated circuit device according to claim 14, wherein said second power supply circuit comprises:

a logical functional unit line power generator generating the second line voltage to be supplied to said logical functional unit; and a system clock line power generator generating the second line voltage to be supplied to said system clock generator.

16. The semiconductor integrated circuit device according to claim 15, wherein said logical functional unit line power generator is disposed in a vicinity of a four-sided outer circumference of a semiconductor chip.

17. The semiconductor integrated circuit device according to claim 12, wherein said first power supply circuit is disposed within said nonvolatile memory.

18. The semiconductor integrated circuit device according to claim 12, wherein said first line power generator and said second line power generator are arranged on an outer circumference of said nonvolatile memory.

19. The semiconductor integrated circuit device according to claim 12, wherein first said line power generator and said second line power generator are arranged in an L shape on an outer circumference of said nonvolatile memory.

20. The semiconductor integrated circuit device according to claim 12, wherein the absolute value of said first line voltage is greater than the absolute value of said second line voltage.

* * * * *